(12) United States Patent
Park

(10) Patent No.: US 11,854,626 B2
(45) Date of Patent: Dec. 26, 2023

(54) STORAGE DEVICE RELATED TO PERFORMING A READ OPERATION AND METHOD OF OPERATING THE STORAGE DEVICE

(71) Applicant: SK hynix Inc., Icheon-si (KR)

(72) Inventor: Kang Woo Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 96 days.

(21) Appl. No.: 17/546,595

(22) Filed: Dec. 9, 2021

(65) Prior Publication Data

US 2023/0005550 A1 Jan. 5, 2023

(30) Foreign Application Priority Data

Jul. 1, 2021 (KR) .......................... 10-2021-0086589

(51) Int. Cl.
  *G11C 16/26* (2006.01)
  *G11C 16/24* (2006.01)
  (Continued)

(52) U.S. Cl.
  CPC .............. *G11C 16/26* (2013.01); *G06F 3/061* (2013.01); *G06F 3/0659* (2013.01);
  (Continued)

(58) Field of Classification Search
  CPC ..... G11C 16/26; G11C 16/24; G11C 16/0483; G11C 16/08; G06F 3/061; G06F 3/0659; G06F 3/0679
  (Continued)

(56) References Cited

U.S. PATENT DOCUMENTS 8,576,624 B2 * 11/2013 Dutta ................... G11C 11/5642
  365/185.21
9,632,868 B2 * 4/2017 Song .................... G11C 29/028
  (Continued)

FOREIGN PATENT DOCUMENTS

KR    1020190084779 A    7/2019

OTHER PUBLICATIONS

Doo-Hyun Kim et al., A 1Tb 4b/cell NAND Flash Memory with tPROG=2ms, tR=110 μs and 1.2Gb/s High-Speed IO Rate, 2020 IEEE International Solid-State Circuits Conference—(ISSCC), Apr. 13, 2020, Samsung Electronics, Hwaseong, Korea, pp. 218-220.

*Primary Examiner* — Son L Mai
(74) *Attorney, Agent, or Firm* — WILLIAM PARK & ASSOCIATES LTD.

(57) ABSTRACT

A memory device including a plurality of memory cells, a peripheral circuit, and a control logic. The peripheral circuit performs a first read operation using a plurality of read voltages on selected memory cells. The control logic controls the peripheral circuit to perform a cell counting operation, adjust remaining read voltages among the plurality of read voltages based on a read offset table and a cell count which is a result of the cell counting operation, and perform a first read operation on the selected memory cell with the remaining read voltages, in the first read operation. The control logic performs a read data output operation of a second read operation performed before the first read operation and the cell counting operation corresponding to the first read operation in parallel among a plurality of successively performed read operations.

20 Claims, 15 Drawing Sheets

(51) Int. Cl.
  *G06F 3/06* (2006.01)
  *G11C 16/04* (2006.01)
  *G11C 16/08* (2006.01)

(52) U.S. Cl.
  CPC ............ *G06F 3/0679* (2013.01); *G11C 16/24* (2013.01); *G11C 16/0483* (2013.01); *G11C 16/08* (2013.01)

(58) Field of Classification Search
  USPC ........................................ 365/189.09, 185.21
  See application file for complete search history.

(56) References Cited

U.S. PATENT DOCUMENTS

| | | | |
|---|---|---|---|
| 9,703,719 B2 | 7/2017 | Balakrishnan et al. | |
| 10,229,749 B2 * | 3/2019 | Oh | G11C 11/5642 |
| 10,381,090 B2 * | 8/2019 | Oh | G11C 29/50004 |
| 10,607,708 B2 * | 3/2020 | Oh | G11C 16/3495 |
| 10,734,082 B2 * | 8/2020 | Lee | G11C 16/24 |

* cited by examiner

FIG. 6

Fail Bit Count Level : C1

| First Read Voltage | Read Voltage Offsets ||||||| 
| | R1 | R2 | R3 | R4 | R5 | R6 | R7 |
| --- | --- | --- | --- | --- | --- | --- | --- |
| R1 | – | RO2_1 | RO3_1 | RO4_1 | RO5_1 | RO6_1 | RO7_1 |
| R2 | RO1_2 | – | RO3_2 | RO4_2 | RO5_2 | RO6_2 | RO7_2 |
| R3 | RO1_3 | RO2_3 | – | RO4_3 | RO5_3 | RO6_3 | RO7_3 |
| R4 | RO1_4 | RO2_4 | RO3_4 | – | RO5_4 | RO6_4 | RO7_4 |
| R5 | RO1_5 | RO2_5 | RO3_5 | RO4_5 | – | RO6_5 | RO7_5 |
| R6 | RO1_6 | RO2_6 | RO3_6 | RO4_6 | RO5_6 | – | RO7_6 |
| R7 | RO1_7 | RO2_7 | RO3_7 | RO4_7 | RO5_7 | RO6_7 | – |

STORAGE DEVICE RELATED TO PERFORMING A READ OPERATION AND METHOD OF OPERATING THE STORAGE DEVICE

CROSS-REFERENCE TO RELATED APPLICATION

The present application claims priority under 35 U.S.C. § 119(a) to Korean patent application number 10-2021-0086589, filed on Jul. 1, 2021, which is incorporated herein by reference in its entirety.

BACKGROUND

1. Technical Field

The present disclosure relates to an electronic device, and more particularly, to a storage device suitable for performing a read operation and a method of operating the storage device.

2. Related Art

A storage device is a device that stores data under control of a host device such as a computer or a smartphone. A storage device may include a memory device in which data is stored and a memory controller controlling the memory device. The memory device is divided into a volatile memory device and a nonvolatile memory device.

The volatile memory device is a device that stores data only when power is supplied and loses the stored data when the power supply is cut off. The volatile memory device includes a static random access memory (SRAM), a dynamic random access memory (DRAM), and the like.

The nonvolatile memory device is a device that does not lose data even though power is cut off. The nonvolatile memory device includes a read only memory (ROM), a programmable ROM (PROM), an electrically programmable ROM (EPROM), an electrically erasable and programmable ROM (EEPROM), a flash memory, and the like.

SUMMARY

According to an embodiment of the present disclosure, a memory device may include a plurality of memory cells, a peripheral circuit, and control logic. The peripheral circuit may perform a first read operation using a plurality of read voltages on selected memory cells among the plurality of memory cells. The control logic may control the peripheral circuit to perform a cell counting operation of sensing the selected memory cells with a first read voltage among the plurality of read voltages, adjust remaining read voltages among the plurality of read voltages based on a read offset table and a cell count which is a result of the cell counting operation, and perform the first read operation on the selected memory cell with the remaining read voltages, in the first read operation. The control logic may perform a read data output operation of a second read operation performed before the first read operation and the cell counting operation corresponding to the first read operation in parallel among a plurality of successively performed read operations.

According to an embodiment of the present disclosure, a method of operating a memory device including a plurality of memory cells may include performing a first read operation using a plurality of read voltages on selected memory cells among the plurality of memory cells in response to a first read command, and outputting read data of a second read operation on the plurality of memory cells in response to a second read command received before the first read command. Performing the first read operation may include performing a cell counting operation of sensing the selected memory cells using a first read voltage among the plurality of read voltages, adjusting remaining read voltages among the plurality of read voltages based on a read offset table and a cell count which is a result of the cell counting operation, and performing the first read operation on the selected memory cell using the remaining read voltages. Performing the cell counting operation may be performed in parallel with outputting the read data of the second read operation.

According to an embodiment of the present disclosure, a storage device may include a memory device and a memory controller. The memory device may include a plurality of memory cells. The memory controller may provide first and second read commands for instructing a cache read operation on the plurality of memory cells to the memory device. The memory device may perform a read operation using a plurality of read voltages on the plurality of memory cells in response to the second read command, perform a cell counting operation of sensing the plurality of memory cells with a first read voltage among the plurality of read voltages in the read operation, adjust remaining read voltages among the plurality of read voltages based on a read offset table and a cell count which is a result of the cell counting operation, perform the read operation on the plurality of memory cells with the remaining read voltages, and perform an output operation of read data according to the first read command received before the second read command and the cell counting operation in parallel.

BRIEF DESCRIPTION OF THE DRAWINGS

FIG. 6 is a diagram illustrating a read offset table of FIG. 2.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure provides a storage device performing a read operation having improved cache read performance and a method of operating the storage device.

According to the present technology, in an embodiment, a storage device performing a read operation having improved cache read performance and a method of operating the storage device are provided.

Figure 1:
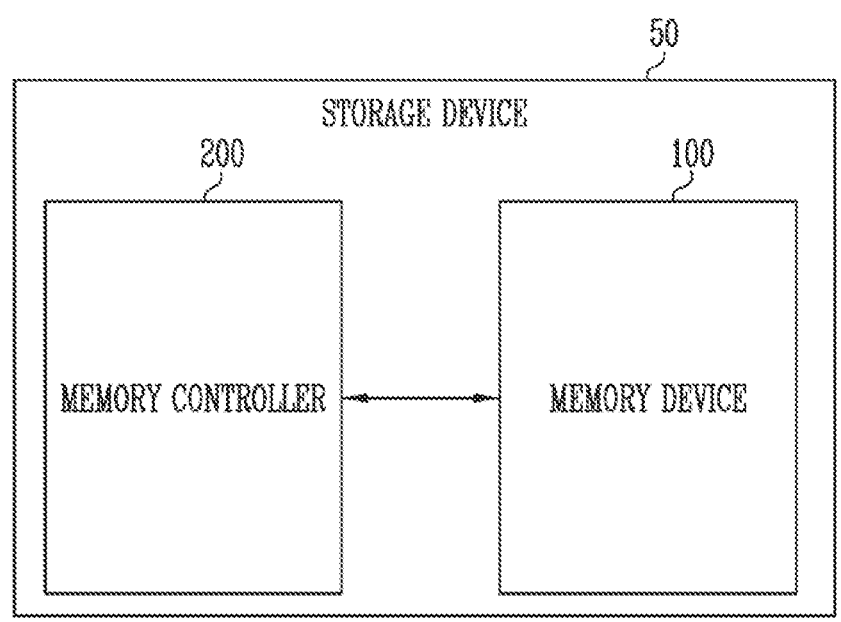
FIG. 1 is a diagram illustrating a storage device according to an embodiment of the present disclosure.

FIG. 1 is a diagram illustrating a storage device according to an embodiment of the present disclosure.

Referring to FIG. 1, the storage device 50 may include a memory device 100 and a memory controller 200 that controls an operation of the memory device. The storage device 50 is a device that stores data under control of a host such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array including a plurality of memory cells that store data.

Each of the memory cells may be configured as a single level cell (SLC) storing one data bit, a multi-level cell (MLC) storing two data bits, a triple level cell (TLC) storing three data bits, or a quad level cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100.

The memory block may be a unit for erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command and an address from the memory controller 200 and access an area selected by the address of the memory cell array. That is, the memory device 100 may perform an operation instructed by the command on the area selected by the address. For example, the memory device 100 may perform a write operation (program operation), a read operation, and an erase operation. During the program operation, the memory device 100 may program data to the area selected by the address. During the read operation, the memory device 100 may read data from the area selected by the address. During the erase operation, the memory device 100 may erase data stored in the area selected by the address.

In an embodiment, the memory device 100 may include a plurality of memory cells. The memory device 100 may receive first and second read commands for instructing a cache read operation on the plurality of memory cells from the memory controller 200. The cache read operation may be performed by overlapping a read data output operation for a previous read command and a read operation for a current read command.

The memory device 100 may perform the read operation on the plurality of memory cells in response to the first read command.

The memory device 100 may perform the read operation on the plurality of memory cells in response to the second read command. The memory device 100 may perform the read operation according to the second read command using a plurality of read voltages. The memory device 100 may perform a cell counting operation of sensing the plurality of memory cells with a first read voltage among the plurality of read voltages.

The memory device 100 may adjust remaining read voltages among the plurality of read voltages based on a read offset table and a cell count which is a result of the cell counting operation. The read offset table may include at least one of read voltage offsets, bit line precharge voltage offsets, and evaluation time offsets corresponding to each of the plurality of read voltages. The memory device 100 may adjust at least one of a read voltage level, a bit line precharge level, and an evaluation time of the remaining read voltages, based on the cell count and the read offset table. The memory device 100 may perform the read operation on the plurality of memory cells with the remaining read voltages.

The memory device 100 may perform an output operation of read data according to the first read command received before the second read command and the cell counting operation corresponding to the second read command in parallel.

The memory controller 200 controls an overall operation of the storage device 50.

When power is applied to the storage device 50, the memory controller 200 may execute firmware FW. When the memory device 100 is a flash memory device, the memory controller 200 may operate firmware such as a flash translation layer (FTL) for controlling communication between the host and the memory device 100.

In an embodiment, the memory controller 200 may receive data and a logical block address (LBA) from the host and convert the logical block address (LBA) into a physical block address (PBA) indicating an address of memory cells in which data included in the memory device 100 is to be stored.

The memory controller 200 may control the memory device 100 to perform the program operation, the read operation, or the erase operation in response to a request of the host. During the program operation, the memory controller 200 may provide a write command, a physical block address, and data to the memory device 100. During the read operation, the memory controller 200 may provide a read command and the physical block address to the memory device 100. During the erase operation, the memory controller 200 may provide an erase command and the physical block address to the memory device 100.

In an embodiment, the memory controller 200 may generate and transmit the command, the address, and the data to the memory device 100 regardless of the request from the host. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. In this case, the memory controller 200 may control the memory devices 100 according to an interleaving method to improve operation performance. The interleaving method may be an operation method for overlapping operation periods of at least two memory devices 100.

The host may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
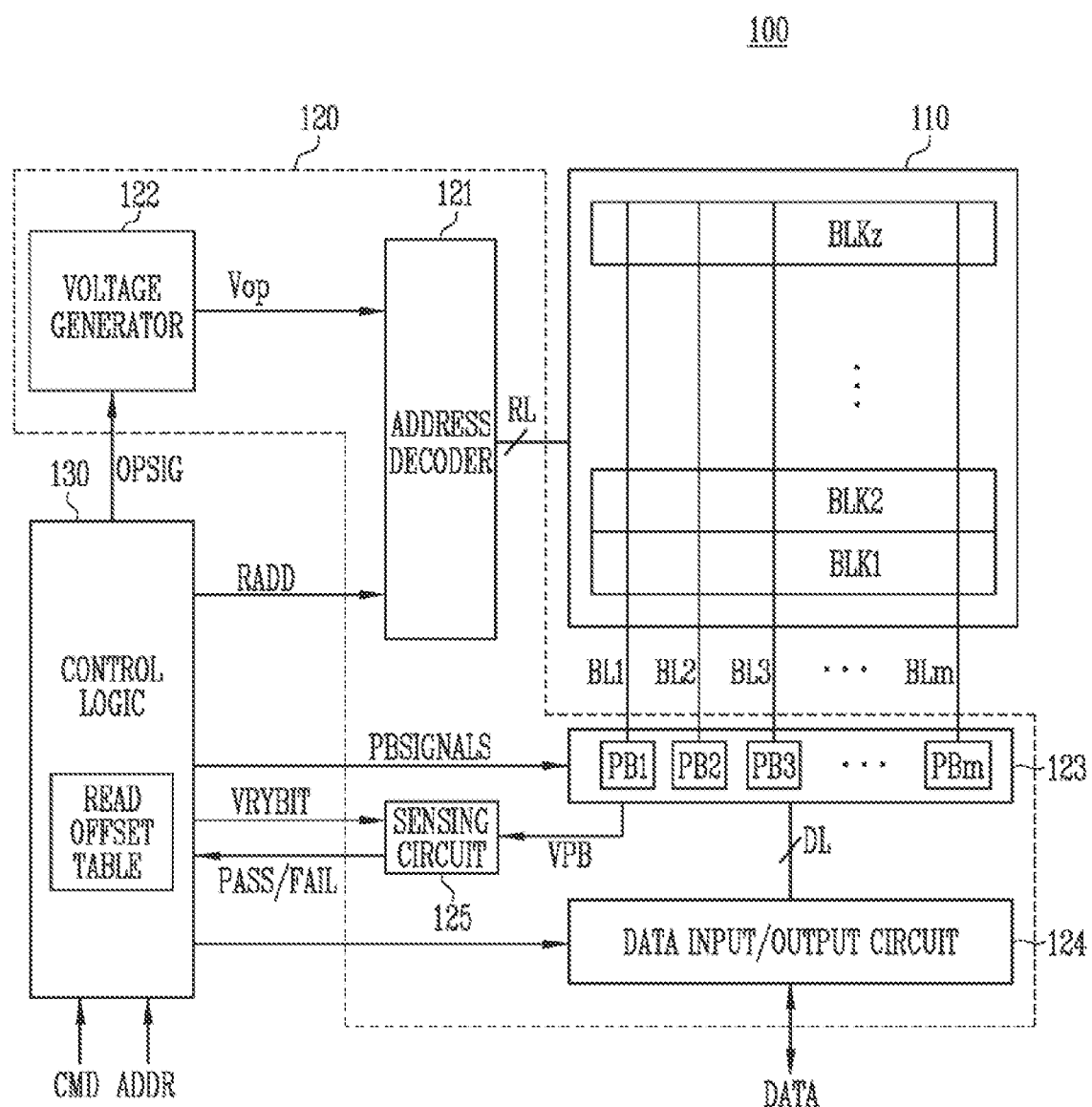
FIG. 2 is a diagram illustrating a structure of a memory device of FIG. 1.

FIG. 2 is a diagram illustrating a structure of the memory device of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. As an embodiment, the plurality of memory cells are nonvolatile memory cells. Memory cells connected to the same word line among the plurality of memory cells are defined as one physical page. That is, the memory cell array 110 is configured of a plurality of physical pages. According to an embodiment of the present disclosure, each of the plurality of memory blocks BLK1 to BLKz included in the memory cell array 110 may include a plurality of dummy cells. At least one of the dummy cells may be connected in series between a drain select transistor and the memory cells and between a source select transistor and the memory cells.

Each of the memory cells of the memory device 100 may be configured as a single-level cell (SLC) that stores one data bit, a multi-level cell (MLC) that stores two data bits, a triple-level cell (TLC) that stores three data bits, or a quad-level cell (QLC) that stores four data bits.

The peripheral circuit 120 may include an address decoder 121, a voltage generator 122, the read and write circuit 123, a data input/output circuit 124, and a sensing circuit 125.

The peripheral circuit 120 drives the memory cell array 110. For example, the peripheral circuit 120 may control voltages applied to the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 is configured to operate in response to control of the control logic 130. The address decoder 121 receives an address ADDR from the control logic 130.

The address decoder 121 is configured to decode a block address of the received address ADDR. The address decoder 121 selects at least one memory block among the memory blocks BLK1 to BLKz according to the decoded block address. The address decoder 121 is configured to decode a row address of the received address ADDR. The address decoder 121 may select at least one word line among word lines of a selected memory block according to the decoded address. The address decoder 121 may apply an operation voltage Vop received from the voltage generator 122 to the selected word line.

During the program operation, the address decoder 121 may apply a program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

According to an embodiment of the present disclosure, the erase operation of the memory device 100 is performed in a memory block unit. The address ADDR input to the memory device 100 during the erase operation includes a block address. The address decoder 121 may decode the block address and select at least one memory block according to the decoded block address. During the erase operation, the address decoder 121 may apply a ground voltage to the word lines input to the selected memory block.

According to an embodiment of the present disclosure, the address decoder 121 may be configured to decode a column address of the transferred address ADDR. The decoded column address may be transferred to the read and write circuit 123. As an example, the address decoder 121 may include a component such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal voltage and selectively activate the plurality of pumping capacitors in response to the control logic 130 to generate the plurality of operation voltages Vop.

The plurality of generated operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. At a time of program, the first to m-th page buffers PB1 to PBm receive the data DATA to be stored through the data input/output circuit 124 and data lines DL.

During the program operation, when a program voltage is applied to the selected word line, the first to m-th page buffers PB1 to PBm may transfer the data DATA to be stored, that is, the data DATA received through the data input/output circuit 124 to the selected memory cells through the bit lines BL1 to BLm. The memory cells of the selected page are programmed according to the transferred data DATA. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the read and write circuit 123 may read the data DATA from the memory cells of the selected page through the bit lines BL and store the read data DATA in the first to m-th page buffers PB1 to PBm.

During the erase operation, the read and write circuit 123 may float the bit lines BL. As an embodiment, the read and write circuit 123 may include a column decoder.

In an embodiment, the read and write circuit 123 may include a page buffer circuit, a first buffer circuit, and a second buffer circuit.

The page buffer circuit may include a plurality of page buffers. In FIG. 2, the plurality of page buffers may be first to m-th page buffers PB1 to PBm.

The first buffer circuit may include first cache buffers storing data received from the page buffer circuit.

The second buffer circuit may include second cache buffers storing the data received from the page buffer circuit. In another embodiment, the second buffer circuit may include a plurality of adders accumulating and adding the data received from the page buffer circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs the data DATA transferred from the first to m-th page buffers PB1 to PBm included in the read and write circuit 123 to the external controller.

In an embodiment, the data input/output circuit 124 may include a data pad that outputs data received from the read and write circuit 123 to an external controller.

During the read operation or the verify operation, the sensing circuit 125 may generate a reference current in response to a signal of a permission bit VRYBIT generated by the control logic 130 and may compare a sensing voltage VPB received from the read and write circuit 123 with a reference voltage generated by the reference current to output a pass signal or a fail signal to the control logic 130.

In an embodiment, the sensing circuit 125 may include a fail bit counter that counts a fail bit included in sensing data received from the read and write circuit 123.

The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to a command CMD transferred from an external device.

The control logic 130 may generate various signals in response to the command CMD and the address ADDR to control the peripheral circuit 120. For example, the control logic 130 may generate an operation signal OPSIG, the address ADDR, a read and write circuit control signal PBSIGNALS, and the permission bit VRYBIT in response to the command CMD and the address ADDR. The control logic 130 may output the operation signal OPSIG to the voltage generator 122, output the address ADDR to the address decoder 121, output the read and write control signal to the read and write circuit 123, and output the permission bit VRYBIT to the sensing circuit 125. In addition, the control logic 130 may determine whether the verify operation is passed or failed in response to the pass or fail signal PASS/FAIL output by the sensing circuit 125.

In an embodiment, the peripheral circuit 120 may perform a first read operation using a plurality of read voltages on selected memory cells among the plurality of memory cells.

The control logic 130 may control the peripheral circuit 120 to perform a cell counting operation of sensing selected memory cells with a first read voltage among the plurality of read voltages in the first read operation. The cell counting operation may be an operation of counting the number of data bits having a set logic value among data bits sensed from the selected memory cells.

The control logic 130 may adjust the remaining read voltages among the plurality of read voltages based on the read offset table and the cell count which is a result of the cell counting operation. The control logic 130 may store the read offset table. As described with reference to FIG. 6, the read offset table may include at least one of the read voltage offsets, the bit line precharge voltage offsets, and the evaluation time offsets corresponding to each of the plurality of read voltages. As described with reference to FIGS. 7 and 13, the control logic 130 may adjust at least one of the read voltage level, the bit line precharge level, and the evaluation time of the remaining read voltages, based on the cell count and the read offset table. The control logic 130 may control the peripheral circuit 120 to perform the first read operation on the selected memory cell with the adjusted remaining read voltages.

The control logic 130 may control the peripheral circuit 120 to perform a read data output operation of a second read operation and the cell counting operation corresponding to the first read operation in parallel. The second read operation may be a read operation performed before the first read operation among a plurality of successively performed read operations. The plurality of successively performed read operations may be a cache read operation.

Figure 3:
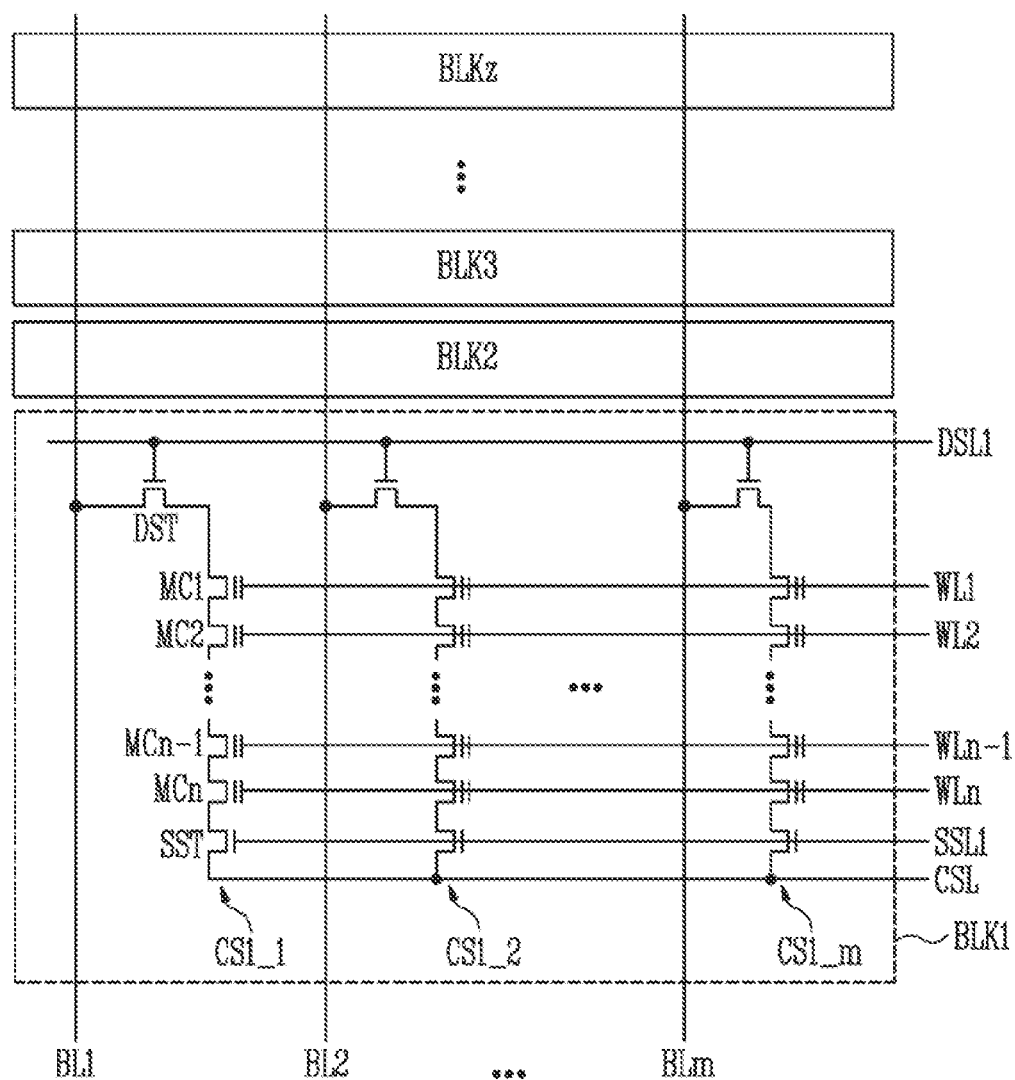
FIG. 3 is a diagram illustrating a memory cell array of FIG. 2.

FIG. 3 is a diagram illustrating the memory cell array of FIG. 2.

Referring to FIG. 3, the first to z-th memory blocks BLK1 to BLKz are commonly connected to the first to m-th bit lines BL1 to BLm. In FIG. 3, for convenience of description, elements included in the first memory block BLK1 of the plurality of memory blocks BLK1 to BLKz are shown, and elements included in each of the remaining memory blocks BLK2 to BLKz are omitted. It will be understood that each of the remaining memory blocks BLK2 to BLKz is configured similarly to the first memory block BLK1.

The memory block BLK1 may include a plurality of cell strings CS1_1 to CS1_m (m is a positive integer). The first to m-th cell strings CS1_1 to CS1_m are connected to the first to m-th bit lines BL1 to BLm, respectively. Each of the first to m-th cell strings CS1_1 to CS1_m includes a drain select transistor DST, a plurality of memory cells MC1 to MCn connected in series (n is a positive integer), and a source select transistor SST.

Gate terminals of the drain select transistors DST included in each of the first to m-th cell strings CS1_1 to CS1_m are connected to a drain select line DSL1. Gate terminals of the first to n-th memory cells MC1 to MCn included in each of the first to m-th cell strings CS1_1 to CS1_m are connected to the first to n-th word lines WL1 to WLn, respectively. Gate terminals of the source select transistors SST included in each of the first to m-th cell strings CS1_1 to CS1_m are connected to a source select line SSL1.

For convenience of description, a structure of the cell string will be described with reference to the first cell string CS1_1 of the plurality of cell strings CS1_1 to CS1_m. However, it will be understood that each of the remaining cell strings CS1_2 to CS1_m is configured similarly to the first cell string CS1_1.

A drain terminal of the drain select transistor DST included in the first cell string CS1_1 is connected to the first bit line BL1. A source terminal of the drain select transistor DST included in the first cell string CS1_1 is connected to a drain terminal of the first memory cell MC1 included in the first cell string CS1_1. The first to n-th memory cells MC1 to MCn are connected in series with each other. A drain terminal of the source select transistor SST included in the first cell string CS1_1 is connected to a source terminal of the n-th memory cell MCn included in the first cell string CS1_1. A source terminal of the source select transistor SST included in the first cell string CS1_1 is connected to a common source line CSL. As an embodiment, the common source line CSL may be commonly connected to the first to z-th memory blocks BLK1 to BLKz.

The drain select line DSL1, the first to n-th word lines WL1 to WLn, and the source select line SSL1 are included in row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

Figure 4:
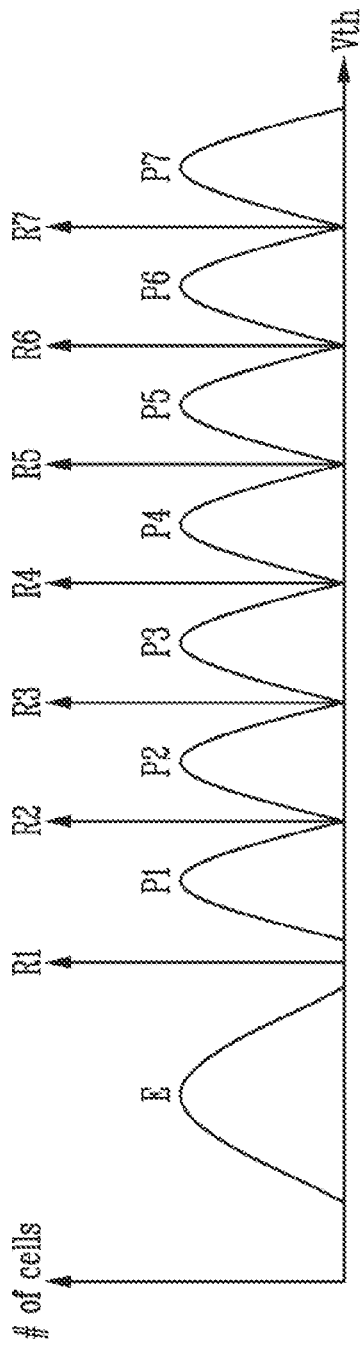
FIG. 4 is a diagram illustrating a read operation using logical page data and a plurality of read voltages according to an embodiment.

FIG. 4 is a diagram illustrating a read operation using logical page data and a plurality of read voltages according to an embodiment.

Referring to FIG. 4, the memory cell may be a TLC storing three data bits. The TLC may store a most significant bit (MSB), a central significant bit (CSB), and a least significant bit (LSB). The number of data bits stored in the memory cell is not limited to the present embodiment.

The memory cell may be programmed to any one of an erase state E and first to seventh program states P1 to P7. The memory cell may store three data bits corresponding to each state. The plurality of read voltages R1 to R7 may be read voltages for distinguishing two adjacent states.

In FIG. 4, the erase state E may correspond to a 3 bit binary code including data bits '111'. The first to seventh program states P1 to P7 may correspond to 3 bit binary codes including the data bits '110', '100', '000', '010', '011', '001' and'101', respectively. A value of the data bits corresponding to each state is not limited to the present embodiment.

During the read operation, a plurality of read voltages may be applied to a selected word line connected to the selected memory cells among the plurality of memory cells. The selected memory cells may configure one physical page.

One physical page may correspond to at least one logical page according to the number of data bits stored in the memory cell. In a case of the TLC, one physical page may correspond to an MSB logical page, a CSB logical page, and an LSB logical page.

The plurality of read voltages may be applied to the selected word lines during the read operation on each logical page. For example, during the read operation on the MSB logic page, read voltages R3 and R7 may be applied to the selected word line. During the read operation on the CSB logic page, read voltages R2, R4, and R6 may be applied to the selected word line. During the read operation on the LSB logic page, read voltages R1 and R5 may be applied to the selected word line.

Figure 5:
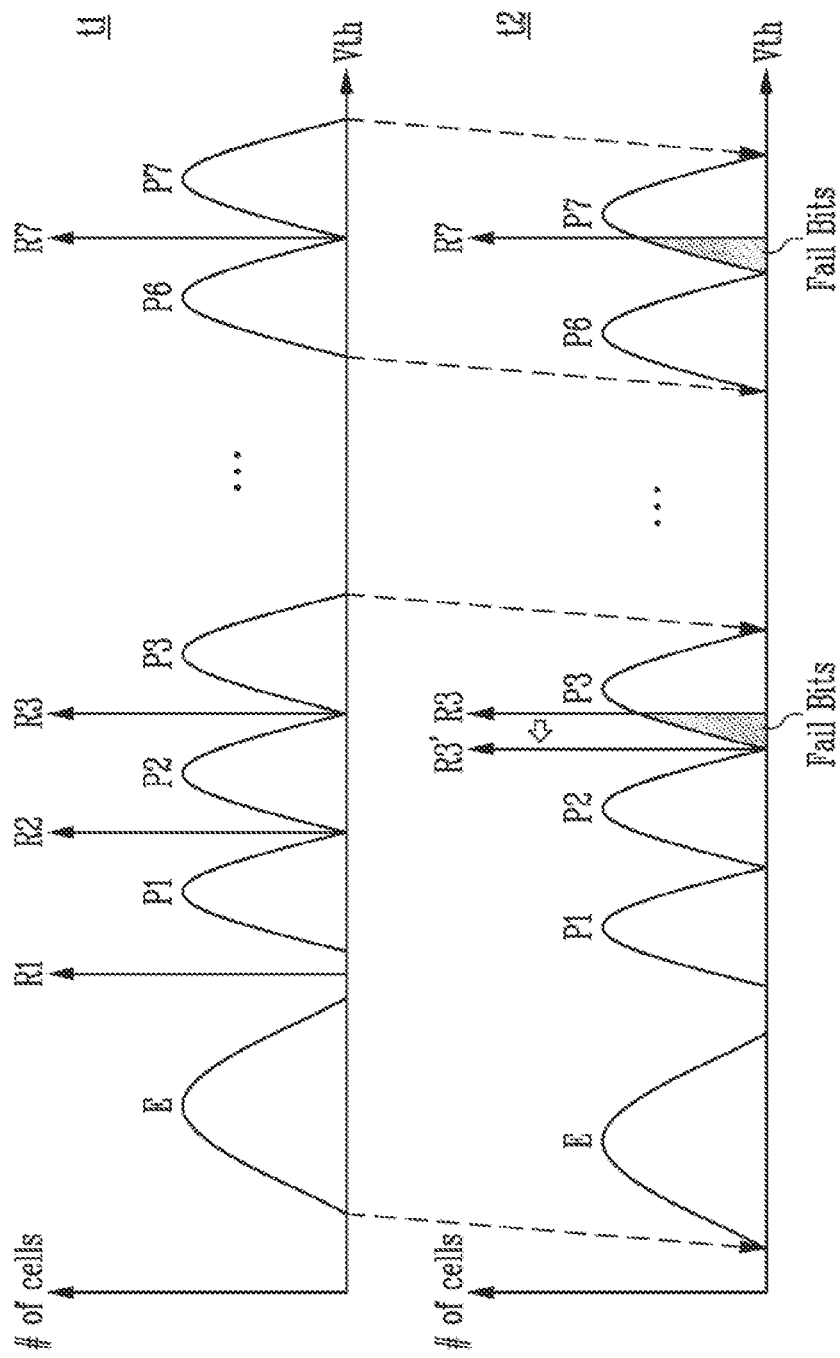
FIG. 5 is a diagram illustrating an embodiment in which remaining read voltages are adjusted based on a result of a cell counting operation using a first read voltage among the plurality of read voltages.

FIG. 5 is a diagram illustrating an embodiment in which the remaining read voltages are adjusted based on a result of the cell counting operation using the first read voltage among the plurality of read voltages.

Referring to FIG. 5, during the program operation, input data may be randomized so that memory cells are evenly distributed in each state. The randomized data may be programmed to the memory cell. t1 may represent an initial threshold voltage distribution of programmed memory cells.

t2 may represent a threshold voltage distribution of memory cells in which retention deterioration has progressed since t1. At t2, the threshold voltage distribution of the memory cells may be shifted to the left compared to t1. However, an aspect in which the threshold voltage distribution of the memory cells is deteriorated is not limited to the present embodiment. For example, a direction in which the threshold voltage distribution is shifted and a degree at which the threshold voltage distribution is shifted may be different for each state.

In FIG. 5, the MSB page read operation described with reference to FIG. 4 may be performed. The read voltages R3 and R7 may be applied to the selected word line in the MSB page read operation.

At t2, during the MSB page read operation, the read voltage R7 may be first applied as a first read voltage to the selected word line. A sensing operation using the read voltage R7 may be performed, and a cell count may be calculated through the fail bit counter. The cell count may be the number of memory cells (fail bits) sensed as the fail bits among memory cells programmed to the seventh program state P7 at t2 compared to t1 which is an initial distribution of the threshold voltage.

The remaining read voltage R3 may be adjusted to a read voltage R3' based on the cell count and the read offset table. At t2, the MSB page read operation may be subsequently performed with the adjusted remaining read voltage R3', and reliability of the read operation may be improved.

The remaining read voltages except for the first read voltage among the plurality of read voltages may be adjusted based on the cell count and the read offset table. The reliability of the read operation may be improved by adjusting the remaining read voltages. This may be defined as an adaptive read operation (an adaptive read using cell counting (ARC)), which is described later with reference to FIG. 7.

FIG. 6 is a diagram illustrating the read offset table of FIG. 2.

Referring to FIG. 6, the read offset table may include at least one of the read voltage offsets, the bit line precharge voltage offsets, and the evaluation time offsets corresponding to each of the plurality of read voltages for each fail bit count level.

In FIG. 6, for convenience of description, only the read voltage offsets corresponding to each of the plurality of read voltages are shown in the read offset table when the fail bit count level is C1. The fail bit count level may be determined according to a size of the cell count described with reference to FIG. 5. The read voltage offset may be a positive number or a negative number. The read voltage offset may be different for each read voltage and for each fall bit count level.

In FIG. 6, when the read voltage R1 among the plurality of read voltages R1 to R7 is the first read voltage which means a read voltage firstly applied to a selected word line in a read operation, and the fail bit count level determined based on the cell count sensed according to the read voltage R1 is C1, read voltage offsets RO2_1 to RO7_1 may be read voltage offsets of the remaining read voltages R2 to R7, respectively. Read voltage levels of the remaining read voltages R2 to R7 may be adjusted based on the read voltage offsets RO2_1 to RO7_1.

When the read voltage R2 among the plurality of read voltages R1 to R7 is the first read voltage and the fail bit count level determined based on the cell count sensed according to the read voltage R2 is C1, read voltage offsets RO1_2 and RO3_2 to RO7_2 may be read voltage offsets of the remaining read voltages R1 and R3 to R7, respectively. Read voltage levels of the remaining read voltages R1 and R3 to R7 may be adjusted based on the read voltage offsets RO1_2 and RO3_2 to RO7_2.

In a similar method, when the read voltage R7 among the plurality of read voltages R1 to R7 is the first read voltage and the fail bit count level determined based on the cell count sensed according to the read voltage R7 is C1, read voltage offsets RO1_7 to RO6_7 may be read voltage offsets of the remaining read voltages R1 to R6, respectively. Read voltage levels of the remaining read voltages R1 to R6 may be adjusted based on the read voltage offsets RO1_7 to RO6_7.

Although an embodiment in which the read voltage level is adjusted according to the read voltage offset is described with reference to FIG. 6, in another embodiment, the bit line precharge voltage level may be adjusted according to a bit line precharge voltage offset corresponding to each read voltage level. In another embodiment, the evaluation time may be adjusted in a sensing period according to an evaluation time offset corresponding to each read voltage level. This is described later with reference to FIG. 13.

Figure 7:
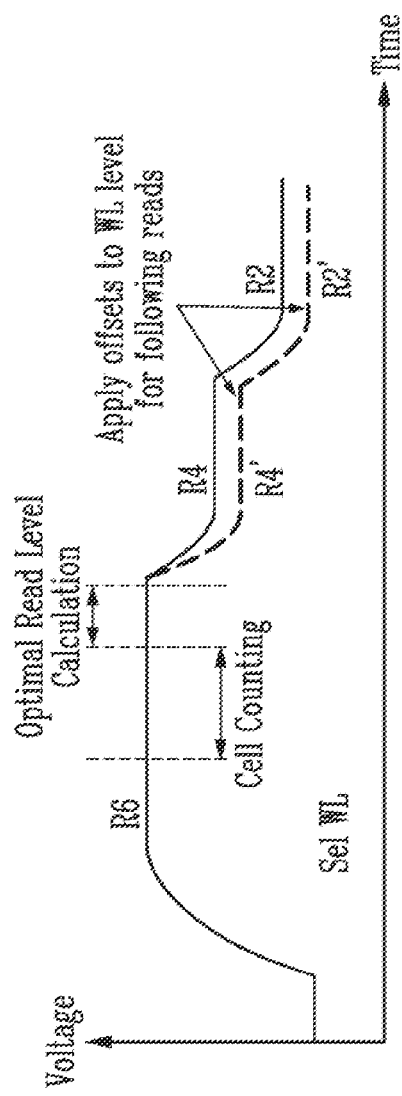
FIG. 7 is a diagram illustrating an adaptive read using cell count (ARC) according to an embodiment.

FIG. 7 is a diagram illustrating an adaptive read using cell count (ARC) according to an embodiment.

Referring to FIG. 7, the plurality of read voltages R6, R4, and R2 may be applied to the selected word line during the CSB logic page read operation described with reference to FIG. 4. The type of the logical page and the plurality of read voltages applied to the selected word line during the read operation are not limited to the present embodiment.

When ARC is performed, the read voltage R6 first applied to the selected word line among the plurality of read voltages may be the first read voltage. The cell counting operation finding the cell count based on data sensed by the read voltage R6 may be performed. Read offsets for the remaining read voltages R4 and R2 may be calculated with reference to the read offset based on the cell count. The remaining read voltages R4 and R2 may be adjusted to read voltages R4' and R2' based on the calculated read offsets.

During a normal read operation, the plurality of read voltages R6, R4, and R2 may be applied to the selected word line. During the ARC, the first read voltage R6 and the remaining adjusted read voltages R4' and R2' may be applied to the selected word line. It may be possible to read data more reliably, than using the normal read operation, by performing the ARC in consideration of a deterioration degree of the threshold voltage distribution of the memory cell. In an embodiment, an optimal read level calculation is a process of finding optimal read voltages using the read offsets. The read offsets may compensate an effect of deterioration degree of the threshold voltage distribution of the memory cell.

Figure 8:
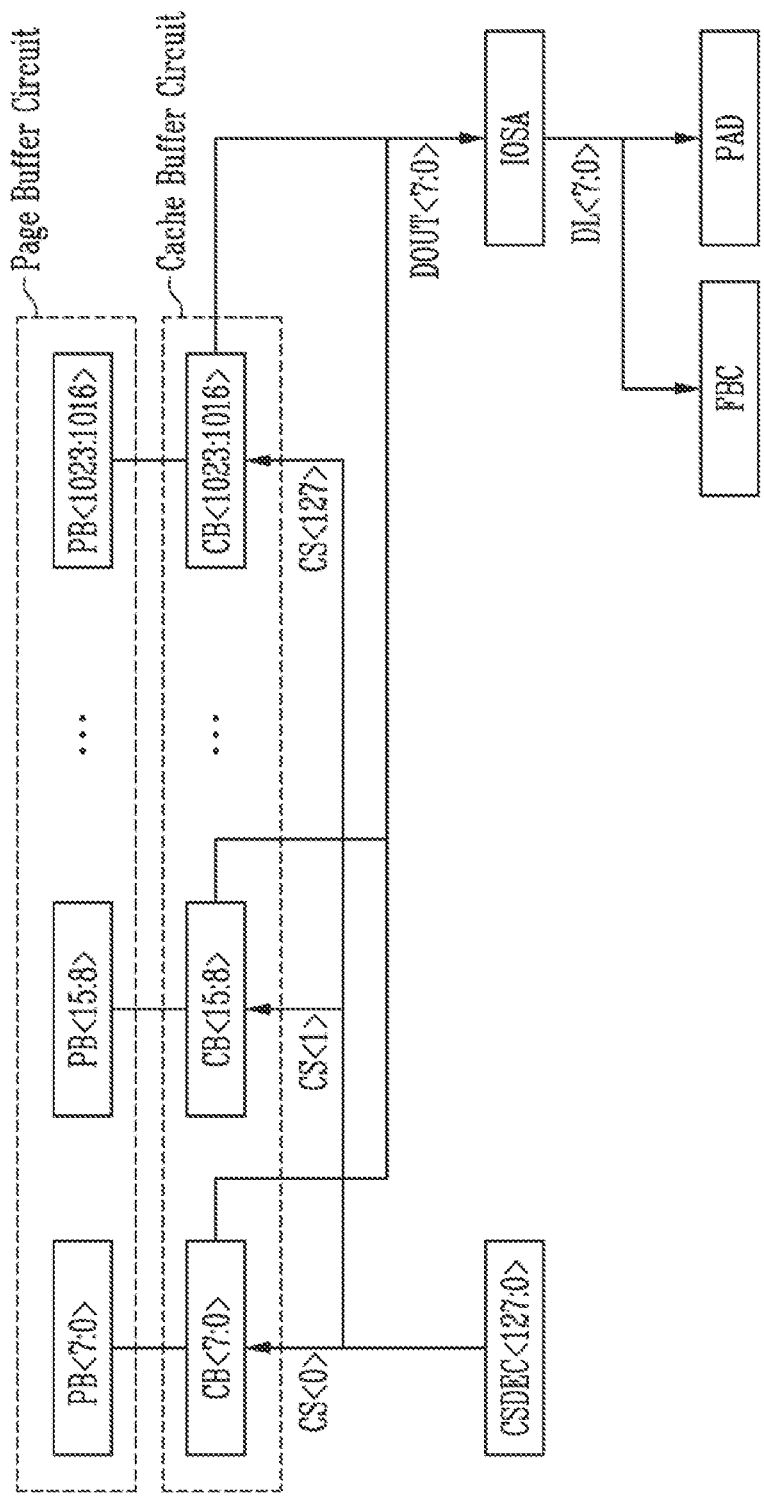
FIG. 8 is a diagram illustrating a read and write circuit of FIG. 2 according to an embodiment.

FIG. 8 is a diagram illustrating the read and write circuit of FIG. 2 according to an embodiment.

Referring to FIG. 8, the read and write circuit may include a page buffer circuit and a cache buffer circuit.

The page buffer circuit may include a plurality of page buffers PB<7:0> to PB<1023:1016>. The cache buffer circuit may include a plurality of cache buffers CB<7:0> to CB<1023:1016>. The plurality of cache buffers CB<7:0> to CB<1023:1016> may be respectively connected to the plurality of page buffers PB<7:0> to PB<1023:1016>.

The number of page buffers included in the page buffer circuit and the number of cache buffers included in the cache buffer circuit are not limited to the present embodiment. The page buffer may store eight data bits. The cache buffer may store eight data bits. The number of data bits stored by the page buffer and the cache buffer is not limited to the present embodiment.

The sensing data sensed from the plurality of memory cells may be stored in the page buffer circuit. The data stored in the page buffer circuit may be transferred to the cache buffer circuit. The data stored in the cache buffer circuit may be sequentially transferred to an input/output sense amplifier IOSA through a data output line DOUT<7:0> according to column select signals CS<0> to CS<127> output by a column selection decoder CSDEC<127:0>. In an embodiment, a column selection decoder CSDEC<n:0> means a group of column selection decoders from CSDEC<n> to CSDEC<0>. That is, the column selection decoder CSDEC<127:0> represents 128 column selection decoders. The data transferred to the input/output sense amplifier IOSA may be output to a data pad PAD or a fail bit counter FBC through a data line DL<7:0>.

In the cell counting operation, the sensing data stored in the page buffer circuit may be transferred to the cache buffer circuit. The sensing data transferred to the cache buffer circuit may be output to the fail bit counter FBC through the data line DL<7:0>. The sensing data may be data obtained by sensing the selected memory cells with the first read voltage among the plurality of read voltages.

In the data output operation, the sensing data stored in the page buffer circuit may be transferred to the cache buffer circuit. The read data may be logic page data obtained by reading the selected memory cells with the plurality of read voltages. The read data transferred to the cache buffer circuit may be output to the data pad PAD through the data line DL<7:0>.

When a cache read operation is performed as will be described later with reference to FIG. 10, since both of a data output operation of a previous read operation and a cell counting operation of a current read operation share one data line DL<7:0>, the data output operation of the previous read operation and the cell counting operation of the current read operation are not be performed in parallel. In other words, performance of the data output operation of the previous read operation and performance of the cell counting operation of the current read operation are not be overlapped. Therefore, since the data output operation of the previous read operation is required to be performed after the cell counting operation of the current read operation, overhead according to the cell counting operation may occur.

Figure 9:
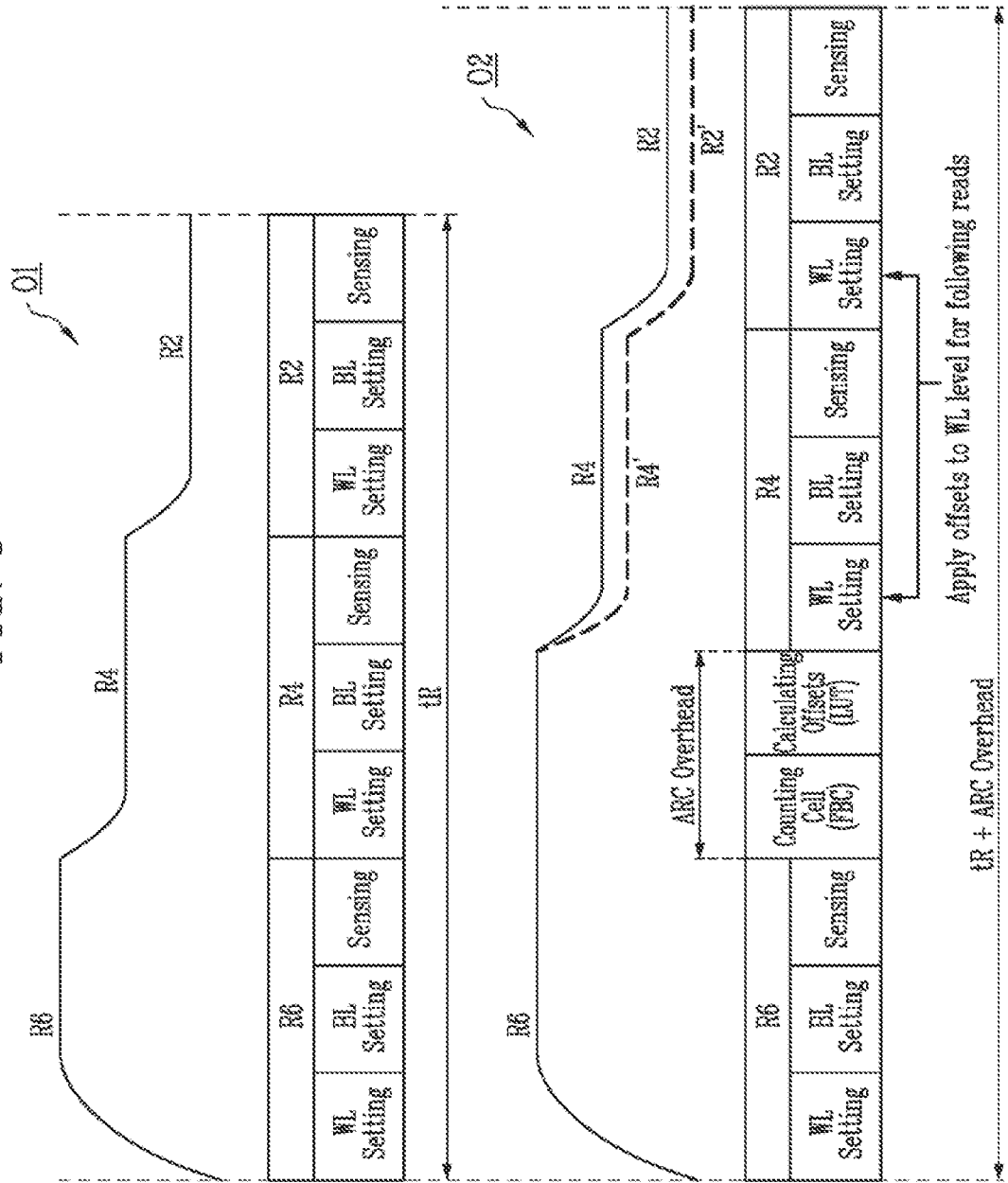
FIG. 9 is a diagram illustrating a normal read operation and the ARC in a read and write circuit structure of FIG. 8.

FIG. 9 is a diagram illustrating the normal read operation and the ARC in a read and write circuit structure of FIG. 8.

Referring to FIG. 9, as described with reference to FIG. 4, the plurality of read voltages may be applied to the selected word line during the read operation. A period in which each read voltage is applied may include a word line voltage setup period (WL Setting), a bit line precharge voltage setup period (BL Setting), and a sensing period for sensing the threshold voltage of the memory cell (Sensing).

A first read operation O1 may be the normal read operation. The plurality of read voltages R6, R4, and R2 may be sequentially applied to the selected word line in the first read operation O1.

The second read operation O2 may be the ARC described with reference to FIG. 6. The first read voltage R6 and the remaining read voltages R4' and R2' may be sequentially applied to the selected word line in the second read operation O2.

The ARC may include overhead due to the cell counting operation and a read offset calculation compared to the normal read operation. The cell counting operation may be an operation of operating the cell count based on data sensed by the first read voltage R6. The read offset calculation may be an operation of calculating a read voltage offset for the remaining read voltages R4 and R2 except for the first read voltage based on the cell count and the read offset table. In a subsequent read operation, the read voltages R4 and R2 may be adjusted to the read voltages R4' and R2' based on the calculated read voltage offset.

Figure 10:
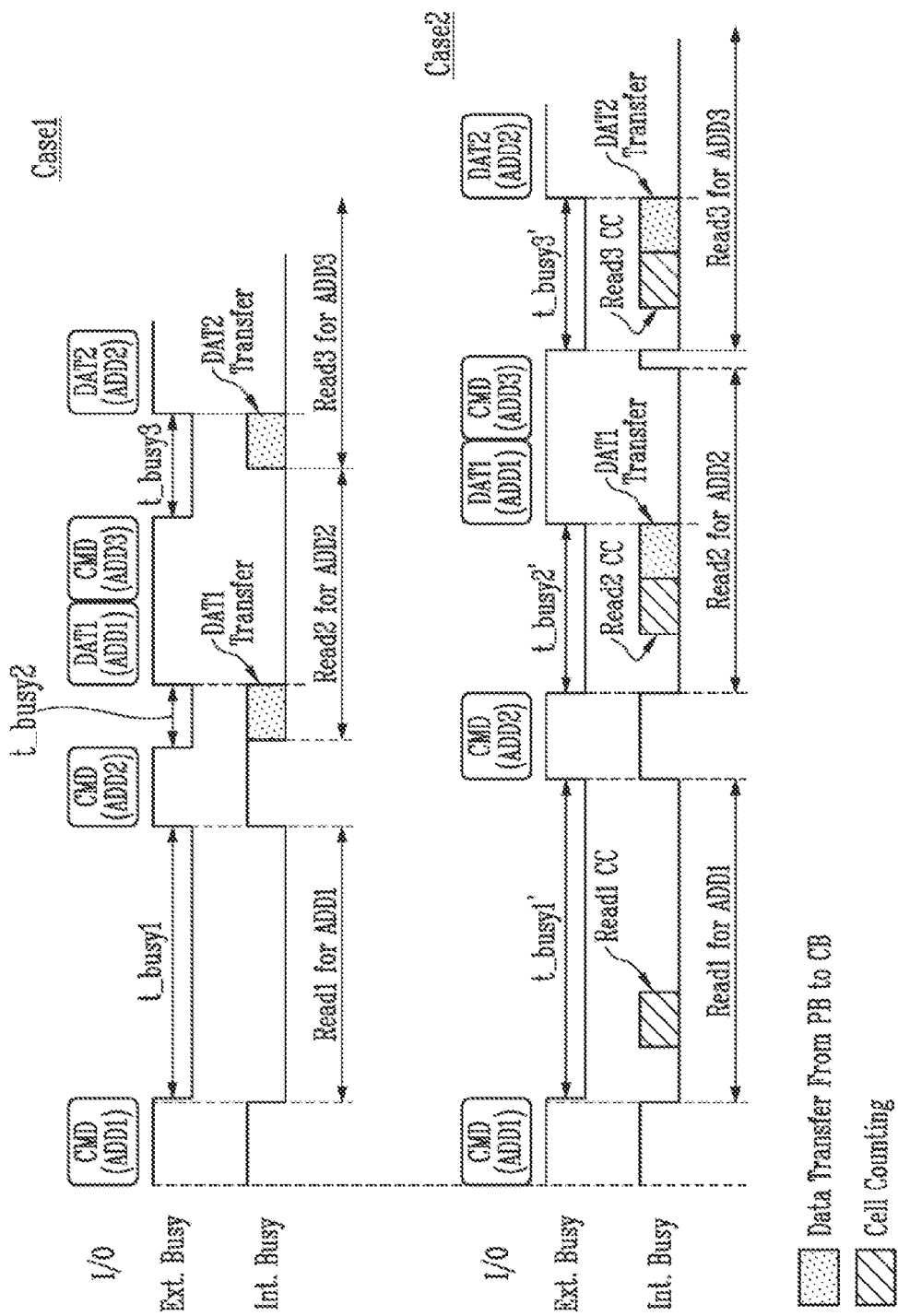
FIG. 10 is a diagram illustrating a delay in a cache read operation in the read and write circuit structure of FIG. 8.

FIG. 10 is a diagram illustrating a delay in the cache read operation in the read and write circuit structure of FIG. 8.

Referring to FIG. 10, a command input to the memory device or data output from the memory device through I/O may be indicated. Ext. Busy may indicate a state in which the memory device is busy or idle from an external point of view of the memory device. Int. Busy may indicate a state in which the memory device is busy or idle from an internal point of view of the memory device.

In Case 1, the cache read operation may be performed based on the normal read operation.

The first command CMD(ADD1) may be input to the memory device. The memory device may perform the first read operation in response to the first command CMD (ADD1). A first cache busy period t_busy1 may be a period in which the first read operation is performed. Read data DAT1 of the first read operation may be stored in the page buffer circuit described with reference to FIG. 8.

When the first read operation is completed, a second command CMD(ADD2) may be input to the memory device. The memory device may perform the second read operation in response to the second command CMD (ADD2). After the second command CMD(ADD2) is input in the second read operation, the read data DAT1 stored in the page buffer circuit may be transferred to the cache buffer circuit. A second cache busy period t_busy2 may be a period in which the read data DAT1 stored in the page buffer circuit is transferred to the cache buffer circuit.

The read data DAT1 transferred to the cache buffer circuit may be output to an outside of the memory device. After the read data DAT1 is output, a third command CMD(ADD3) may be input to the memory device. After the second read operation is completed, read data DAT2 stored in the page buffer circuit may be transferred to the cache buffer circuit. A third cache busy period t_busy3 may be from a time point when the input of the third command CMD(ADD3) is completed to a time point when the transferal of the read data DAT2 to the cache buffer circuit is completed.

In Case2, the cache read operation may be performed based on the ARC.

The first command CMD(ADD1) may be input to the memory device. The memory device may perform the first read operation in response to the first command CMD (ADD1). A first cache busy period t_busy1' may be a period in which the first read operation is performed. At this time, since the first read operation is the ARC different from the normal read operation of Case1, the first cache busy period t_busy1' additionally includes overhead according to the cell counting operation Read1 CC corresponding to the first read operation. The read data DAT1 of the first read operation may be stored in the page buffer circuit described with reference to FIG. 8.

When the first read operation is completed, the second command CMD(ADD2) may be input to the memory device. The memory device may perform the second read operation in response to the second command CMD (ADD2). Since the second read operation is the ARC, a cell counting operation Read2 CC corresponding to the second read operation may be included.

Due to the cell counting operation Read2 CC corresponding to the second read operation, the read data DAT1 stored in the page buffer circuit in the second read operation are not be directly transferred to the cache buffer circuit after the input of the second command CMD(ADD2) is completed. This is because the performance of the data output operation of the previous read operation and the performance of the cell counting operation of the current read operation are not to be overlapped as described with reference to FIG. 8.

Therefore, after the cell counting operation Read2 CC corresponding to the second read operation is completed, the read data DAT1 stored in the page buffer circuit may be transferred to the cache buffer circuit.

A second cache busy period t_busy2' may be from a time point when the input of the second command CMD(ADD2) is completed to a time point when the transferal of the read data DAT1 to the cache buffer circuit is completed.

The read data DAT1 transferred to the cache buffer circuit may be output to the outside of the memory device. After the read data DAT1 is output, the third command CMD(ADD3) may be input to the memory device. After the input of the third command CMD(ADD3) is completed, a third read operation may be performed. As described above, after a cell counting operation Read3 CC corresponding to the third read operation is completed, the read data DAT2 stored in the page buffer circuit may be transferred to the cache buffer circuit.

A third cache busy period t_busy3' may be from a time point when the input of the third command CMD(ADD3) is completed to a time point when the transferal of the read data DAT2 to the cache buffer circuit is completed.

As described with reference to FIG. 10, when the cache read operation is performed based on the ARC, the data output operation of the previous read operation and the cell counting operation of the current read operation are not to be performed in parallel. Therefore, the cache read operation based on the ARC generally increases a cache busy time compared to the cache read operation based on the normal read operation.

Therefore, a buffer circuit structure for performing the data output operation of the previous read operation and the cell counting operation of the current read operation in parallel is described with reference to FIGS. 11, 12A, and 12B.

Figure 11:
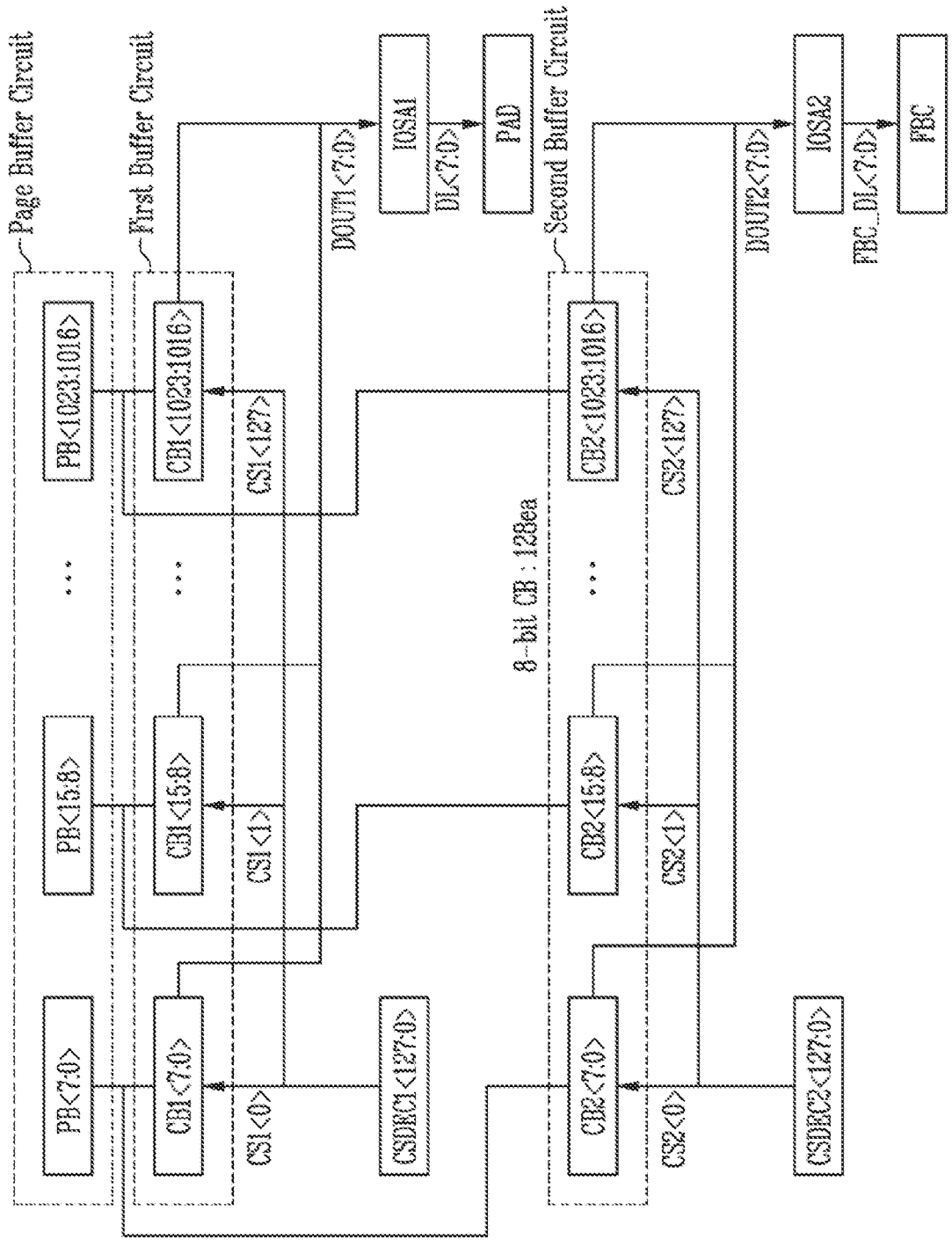
FIG. 11 is a diagram illustrating the read and write circuit of FIG. 2 according to an embodiment.

FIG. 11 is a diagram illustrating the read and write circuit of FIG. 2 according to an embodiment.

Referring to FIG. 11, the read and write circuit may include the page buffer circuit described with reference to FIG. 8. The read and write circuits may include the first buffer circuit and the second buffer circuit. The first buffer circuit may have the same structure as the cache buffer circuit described with reference to FIG. 8. The second buffer circuit may have the same structure as the first buffer circuit.

The first buffer circuit and the second buffer circuit that operate independently of each other may be connected to the page buffer circuit.

The first buffer circuit may be used for the data output operation of the previous read operation. The first buffer circuit may store the read data of the previous read operation.

The second buffer circuit may be used for the cell counting operation corresponding to the current read operation. The second buffer circuit may store the sensing data obtained according to the cell counting operation corresponding to the current read operation.

Therefore, since the first buffer circuit and the second buffer circuit operate independently of each other, the data output operation of the previous read operation and the cell counting operation of the current read operation may be performed in parallel. That is, since the data output operation of the previous read operation and the cell counting operation of the current read operation overlap, an overall cache busy time in the cache read operation based on the ARC may be reduced.

Figure 12A:
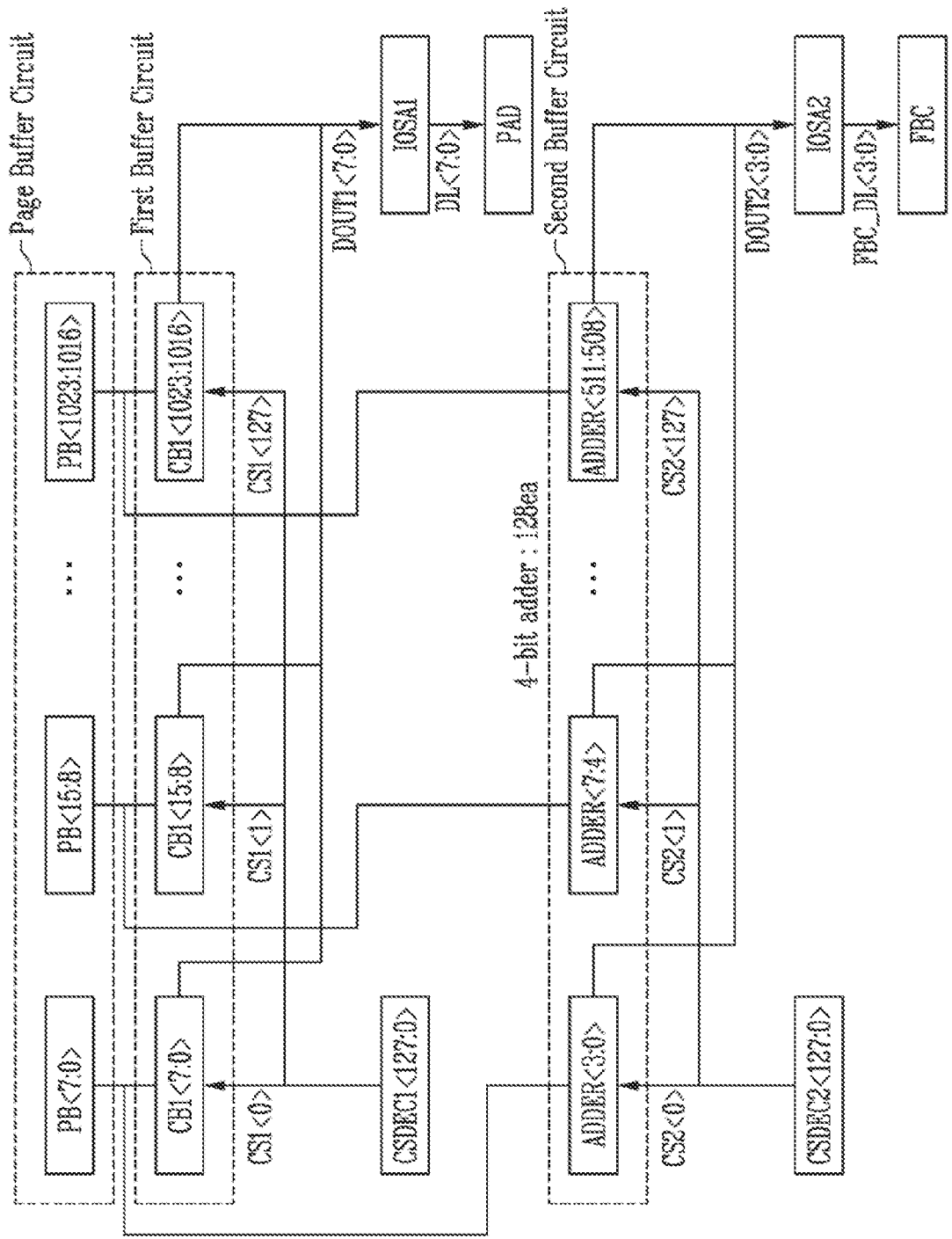
FIG. 12A is a diagram illustrating the read and write circuit of FIG. 2 according to an embodiment.

FIG. 12A is a diagram illustrating the read and write circuit of FIG. 2 according to an embodiment.

Referring to FIG. 12A, the configuration of the page buffer circuit and the first buffer circuit described with reference to FIG. 11 may be the same.

The second buffer circuit may include a plurality of adders instead of the second cache buffers. In FIG. 12A, the adder may be a four bit adder. However, the number of data bits calculated by the adder is not limited to the present embodiment.

Compared to FIG. 11, the second registers for storing eight bits are required in a case of the second cache buffer, but registers for storing four bits are required in a case of the adder. Therefore, the adder may include registers of the number of less than that of the second cache buffer. That is, in an embodiment, by replacing the second cache buffers with the plurality of adders, less number of registers may be used, and the area of the second buffer circuit described with reference to FIG. 11 may be further reduced.

Figure 12B:
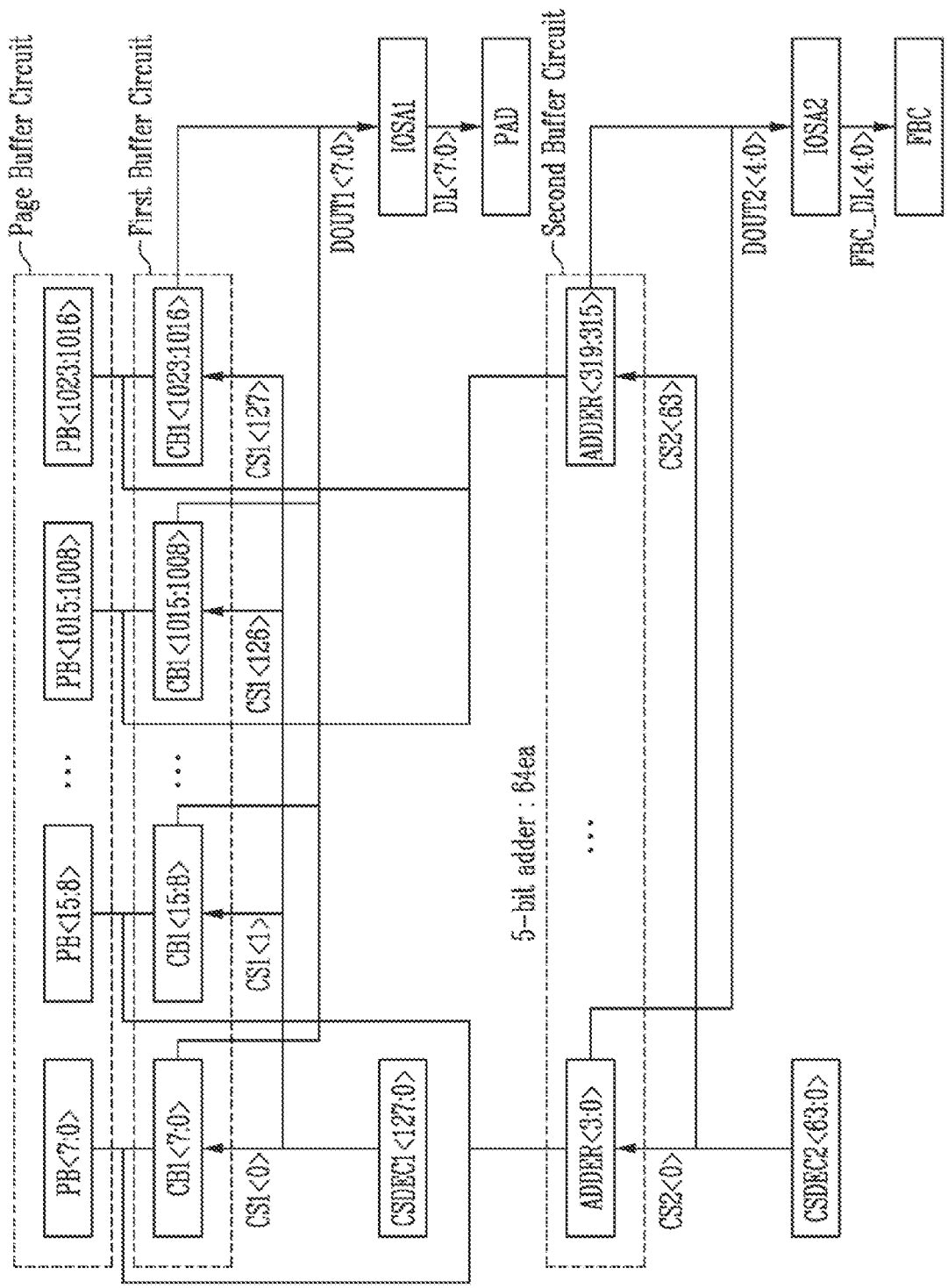
FIG. 12B is a diagram illustrating the read and write circuit of FIG. 2 according to an embodiment.

FIG. 12B is a diagram illustrating the read and write circuit of FIG. 2 according to an embodiment.

The configuration of the page buffer circuit and the first buffer circuit described with reference to FIG. 12A may be the same.

Differently from the four bit adder described with reference to FIG. 12A, an adder in FIG. 12B may be a five bit adder. The number of registers included in one adder is increased by one from four to five, but the total number of adders may be reduced from 128 to 64. Therefore, in an embodiment, the area of the second buffer circuit described with reference to FIG. 12A may be further reduced.

As the number of data bits calculated by the adder increases, the total number of adders decreases but an operation time increases. Therefore, in an embodiment, the number of data bits calculated by the adder may be appropriately set in consideration of the increase of the operation time and the reduction in the total circuit area.

Figure 13:
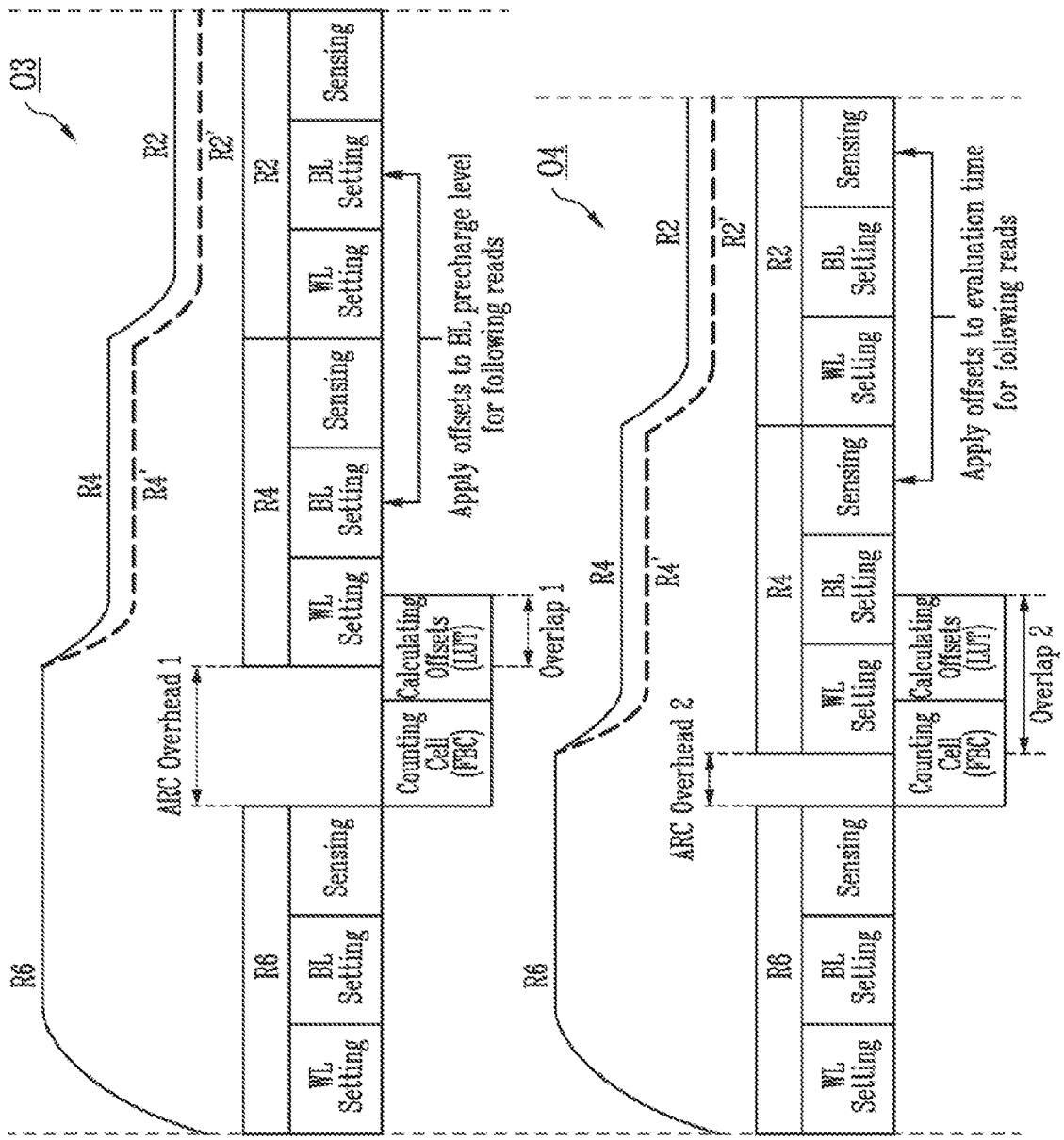
FIG. 13 is a diagram illustrating an embodiment in which overhead of the ARC described with reference to FIGS. 12A and 12B is reduced.

FIG. 13 is a diagram illustrating an embodiment in which overhead of the ARC described with reference to FIGS. 12A and 12B is reduced.

Referring to FIGS. 9 and 13, the second read operation O2 may be the ARC in which the read voltage levels of the remaining read voltages are adjusted based on the cell count and the read offset.

A third operation O3 may be the ARC in which the bit line precharge voltage level of the remaining read voltages is adjusted based on the cell count and the read offset.

A fourth operation O4 may be the ARC in which the evaluation time is adjusted in the sensing period of the remaining read voltages based on the cell count and the read offset.

Figure 14:
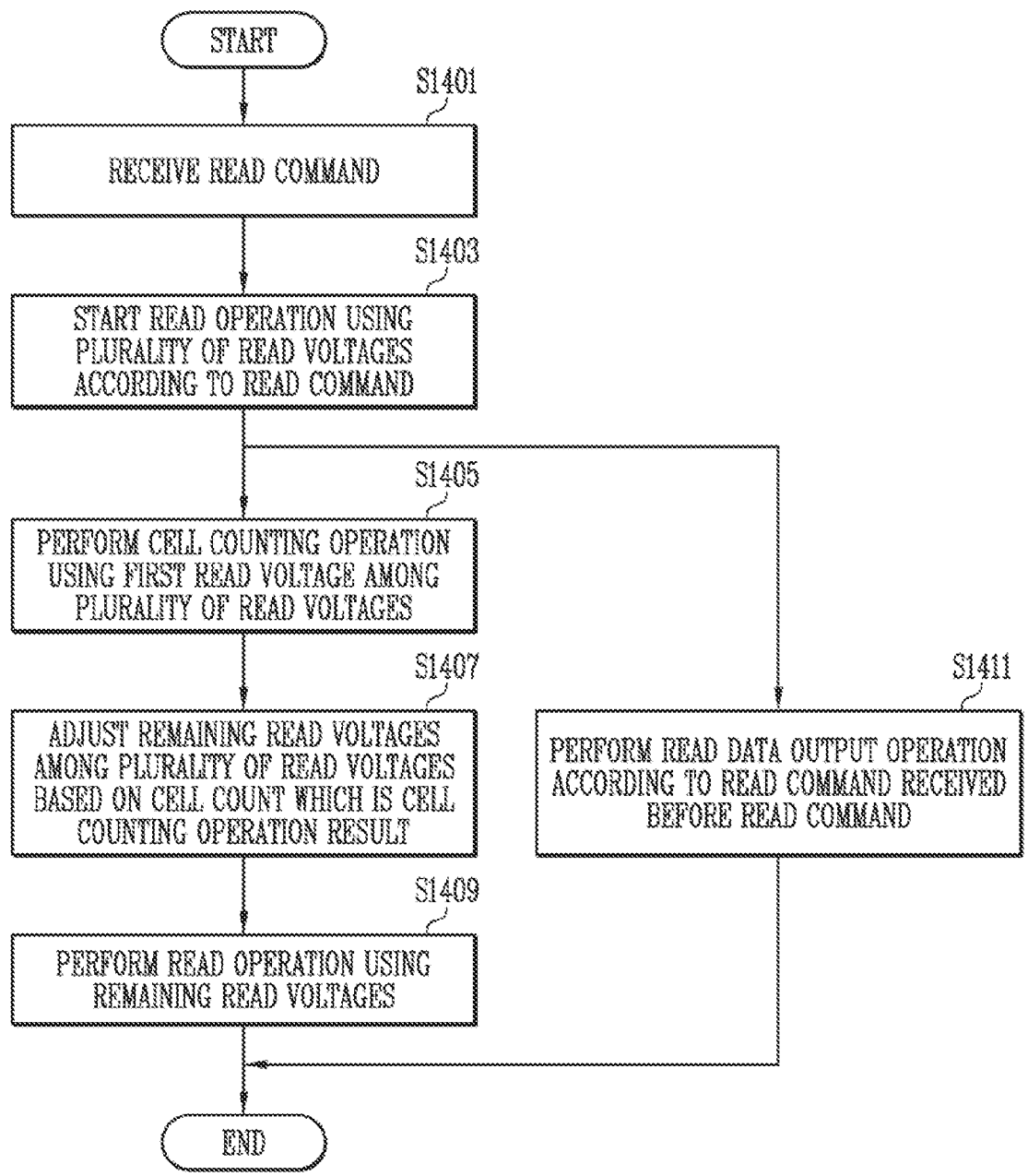
FIG. 14 is a flowchart illustrating an operation of a memory device according to an embodiment of the present disclosure.

FIG. 14 is a flowchart illustrating an operation of a memory device according to an embodiment of the present disclosure.

Referring to FIG. 14, in step S1401, the memory device may receive the read command.

In step S1403, the memory device may start the read operation using the plurality of read voltages according to the read command.

In step S1405, the memory device may perform the cell counting operation using the first read voltage among the plurality of read voltages.

In step S1407, the memory device may adjust the remaining read voltages among the plurality of read voltages based on the cell count which is the result of the cell counting operation.

In step S1409, the memory device may perform the read operation using the remaining read voltages.

In step S1411, the memory device may perform the read data output operation according to the read command received before the read command.

In an embodiment, step S1405 and step S1411 may be performed in parallel. All or some section of step S1405 and step S1411 may overlap each other.

What is claimed is:

1. A memory device comprising:
   a plurality of memory cells;
   a peripheral circuit configured to perform a first read operation using a plurality of read voltages on selected memory cells among the plurality of memory cells; and
   control logic configured to control the peripheral circuit to perform a cell counting operation of sensing the selected memory cells with a first read voltage among the plurality of read voltages, adjust remaining read voltages among the plurality of read voltages based on a read offset table and a cell count which is a result of the cell counting operation, and control the peripheral circuit to perform the first read operation on the selected memory cell with the remaining read voltages, in the first read operation,
   wherein the control logic controls the peripheral circuit to perform a read data output operation of a second read operation performed before the first read operation and the cell counting operation corresponding to the first read operation in parallel among a plurality of successively performed read operations.

2. The memory device of claim 1, wherein the peripheral circuit comprises:
   a page buffer circuit including a plurality of page buffers connected to the plurality of memory cells through bit lines;
   first and second buffer circuits configured to store data received from the page buffer circuit;
   a data pad configured to output data received from the first buffer circuit; and
   a fail bit counter configured to count a fail bit based on data received from the second buffer circuit.

3. The memory device of claim 2, wherein the control logic is configured to control the peripheral circuit to output read data of the second read operation stored in the first buffer circuit to the data pad through a first data line, and output sensing data for the first read voltage stored in the second buffer circuit to the fail bit counter through a second data line.

4. The memory device of claim 3, wherein the first buffer circuit includes first cache buffers respectively connected to the plurality of page buffers,
   the second buffer circuit includes second cache buffers respectively connected to the plurality of page buffers, and
   the fail bit counter is configured to receive the sensing data stored in the second cache buffers through the second data line.

5. The memory device of claim 3, wherein the first buffer circuit includes first cache buffers respectively connected to the plurality of page buffers,
   the second buffer circuit includes a plurality of adders connected to the plurality of page buffers, and
   the fail bit counter is configured to receive a sum of the sensing data stored in the plurality of adders through the second data line.

6. The memory device of claim 5, wherein each of the plurality of adders is connected to at least one page buffer among the plurality of page buffers.

7. The memory device of claim 3, wherein the fail bit counter is configured to operate the cell count corresponding to the first read operation based on the sensing data for the first read voltage.

8. The memory device of claim 1, wherein the read offset table includes at least one of read voltage offsets, bit line precharge voltage offsets, and evaluation time offsets corresponding to each of the plurality of read voltages.

9. The memory device of claim 8, wherein the peripheral circuit is configured to adjust at least one of a read voltage level, a bit line precharge level, and an evaluation time of the remaining read voltages, based on the cell count and the read offset table.

10. A method of operating a memory device including a plurality of memory cells, the method comprising:
    performing a first read operation using a plurality of read voltages on selected memory cells among the plurality of memory cells in response to a first read command; and
    outputting read data of a second read operation on the plurality of memory cells in response to a second read command received before the first read command,
    wherein performing the first read operation comprises:
    performing a cell counting operation of sensing the selected memory cells using a first read voltage among the plurality of read voltages;
    adjusting remaining read voltages among the plurality of read voltages based on a read offset table and a cell count which is a result of the cell counting operation; and
    performing the first read operation on the selected memory cell using the remaining read voltages,
    performing the cell counting operation in parallel with outputting the read data of the second read operation.

11. The method of claim 10, wherein the memory device comprises:
    a page buffer circuit configured to store data sensed from the plurality of memory cells; and
    first and second buffer circuits configured to store data received from the page buffer circuit.

12. The method of claim 11, wherein performing cell counting operation comprises:
    storing sensing data obtained by sensing the selected memory cells with the first read voltage in the page buffer circuit;

transferring the sensing data stored in the page buffer circuit to the second buffer circuit; and operating the cell count based on the sensing data.

13. The method of claim 12, wherein the second buffer circuit includes a plurality of cache buffers storing data bits included in the sensing data, and operating the cell count comprises counting the number of data bits having a logical value set based on the data bits stored in the plurality of cache buffers.

14. The method of claim 12, wherein the second buffer circuit includes a plurality of adders accumulating and adding data bits included in the sensing data in a preset data bit unit, and operating the cell count comprises counting the number of data bits having a logical value set based on values stored in the plurality of adders.

15. The method of claim 11, wherein outputting the read data of the second read operation comprises:

transferring the read data of the second read operation stored in the page buffer circuit to the first buffer circuit; and outputting the read data stored in the first buffer circuit to a data pad.

16. The method of claim 10, wherein the read offset table includes at least one of read voltage offsets, bit line precharge voltage offsets, and evaluation time offsets corresponding to each of the plurality of read voltages.

17. The method of claim 10, wherein adjusting the remaining read voltages comprises adjusting at least one of a read voltage level of the remaining read voltages, a bit line precharge level, and an evaluation time, based on the cell count and the read offset table.

18. A storage device comprising:

a memory device including a plurality of memory cells; and a memory controller configured to provide first and second read commands for instructing a cache read operation on the plurality of memory cells to the memory device, wherein the memory device performs a read operation using a plurality of read voltages on the plurality of memory cells in response to the second read command, performs a cell counting operation of sensing the plurality of memory cells with a first read voltage among the plurality of read voltages in the read operation, adjusts remaining read voltages among the plurality of read voltages based on a read offset table and a cell count which is a result of the cell counting operation, performs the read operation on the plurality of memory cells with the remaining read voltages, and performs an output operation of read data according to the first read command received before the second read command and the cell counting operation in parallel.

19. The storage device of claim 18, wherein the read offset table includes at least one of read voltage offsets, bit line precharge voltage offsets, and evaluation time offsets corresponding to each of the plurality of read voltages.

20. The storage device of claim 19, wherein the memory device adjusts at least one of a read voltage level, a bit line precharge level, and an evaluation time of the remaining read voltages, based on the cell count and the read offset table.

* * * * *